United States Patent
Oh et al.

(10) Patent No.: US 8,784,672 B2
(45) Date of Patent: Jul. 22, 2014

(54) PHOTOMASKS AND METHODS OF MANUFACTURING THE SAME

(75) Inventors: Jong-Keun Oh, Seoul (KR); Dae-Hyuk Kang, Hwaseong-si (KR); Chan-Uk Jeon, Seongnam-si (KR); Hyung-Ho Ko, Hwaseong-si (KR); Sung-Jae Han, Seongnam-si (KR); Jung-Jin Kim, Hwaseong-si (KR)

(73) Assignee: Samsung Electronics Co., Ltd., Suwon-Si, Gyeonggi-Do (KR)

(*) Notice: Subject to any disclaimer, the term of this patent is extended or adjusted under 35 U.S.C. 154(b) by 193 days.

(21) Appl. No.: 13/279,859

(22) Filed: Oct. 24, 2011

(65) Prior Publication Data

US 2012/0148944 A1    Jun. 14, 2012

(30) Foreign Application Priority Data

Dec. 13, 2010  (KR) .......................... 10-2010-0126890

(51) Int. Cl.
*G03F 1/46* (2012.01)
*G03F 1/48* (2012.01)

(52) U.S. Cl.
USPC .................. 216/12; 148/212; 148/240; 430/5

(58) Field of Classification Search
CPC ..................................... G03F 1/46; G03F 1/48
USPC ..................................... 148/212, 240; 216/12
See application file for complete search history.

(56) References Cited

U.S. PATENT DOCUMENTS

2006/0246357 A1* 11/2006 Chen et al. ..................... 430/5
2009/0220867 A1   9/2009 Fujikawa et al.
2011/0027699 A1*  2/2011 Tchikoulaeva et al. ......... 430/5

FOREIGN PATENT DOCUMENTS

| KR | 100174626    | 11/1998 |
| KR | 1020080037702 | 4/2008  |
| KR | 1020090000876 | 1/2009  |
| KR | 1020090033770 | 4/2009  |

OTHER PUBLICATIONS

KIPO Machine Translation of Kim 10-2009-0033770 (published Apr. 6, 2009 from KR application 10-2007-0098981).*

* cited by examiner

*Primary Examiner* — Mark F Huff
*Assistant Examiner* — John S Ruggles
(74) *Attorney, Agent, or Firm* — F. Chau & Associates, LLC

(57) ABSTRACT

In a method of manufacturing a photomask pattern, a light-shielding layer pattern and an anti-reflective layer pattern are formed sequentially on a transparent substrate. Oxidation and nitridation processes are performed on a sidewall of the light-shielding layer pattern to form a protection layer pattern on a lateral portion of the light-shielding layer pattern.

14 Claims, 3 Drawing Sheets

PHOTOMASKS AND METHODS OF MANUFACTURING THE SAME

CROSS-REFERENCE TO RELATED APPLICATIONS

This application claims priority under 35 USC §119 to Korean Patent Application No. 10-2010-0126890 filed on Dec. 13, 2010, the disclosure of which is hereby incorporated by reference herein in it's entirety.

BACKGROUND

1. Technical Field

Example embodiments relate to photomasks and methods of manufacturing the same. More particularly, example embodiments relate to photomasks including a protection layer pattern and methods of manufacturing the same.

2. Description of the Related Art

A photomask for a photolithography process and an exposure process in manufacturing semiconductor devices may be reused after a recycling process. For example, in the recycling process, a pellicle for protecting the photomask may be removed from the photomask and a pellicle may be re-attached to the photomask by a repellicle process.

However, an acidic solution used for removing the pellicle may damage the photomask pattern, and a line width of the photomask pattern may be changed. As semiconductor devices are highly integrated, a small change of the line width of the photomask pattern may severely deteriorate the quality and reliability of the semiconductor devices.

SUMMARY

Example embodiments provide a chemically robust and stable photomask.

Example embodiments provide a method of manufacturing the chemically robust and stable photomask.

According to example embodiments, there is provided a method of manufacturing a photomask. In the method, a light-shielding layer pattern and an anti-reflective layer pattern are formed sequentially on a transparent substrate. Oxidation and nitridation processes are performed on a sidewall of the light-shielding layer pattern to form a protection layer pattern on a lateral portion of the light-shielding layer pattern.

In example embodiments, the oxidation and nitridation processes on the sidewall of the light-shielding layer pattern may be performed by a plasma treatment using oxygen ($O_2$) gas and nitrogen ($N_2$) gas in a reactive gas.

In example embodiments, the mixing ratio of the oxygen gas and the nitrogen gas may be within about 1:5 to about 1:8.

In example embodiments, a chamber for performing the plasma treatment may be maintained at a temperature of about 200° C. to about 400° C.

In example embodiments, the light-shielding layer pattern may include chromium (Cr), aluminum (Al), rubidium (Rb), tantalum (Ta), tantalum boron oxide (TaBO) or tantalum boron nitride (TaBN). These may be used alone or in a combination thereof.

In example embodiments, the light-shielding layer pattern may include chromium.

In example embodiments, the protection layer pattern may include either chromium oxynitride (CrNOx) or a mixture of chromium oxide (CrOx) and chromium nitride (CrNx).

In example embodiments, the anti-reflective layer pattern may include chromium oxide (CrOx), chromium nitride (CrNx), titanium nitride (TiN) or titanium oxide (TiOx). These may be used alone or in a combination thereof.

In example embodiments, the protection layer pattern may not be etched by an acidic solution.

In example embodiments, the oxidation and nitridation processes on the sidewall of the light-shielding layer pattern may be performed by a rapid thermal process (RTP) in an atmosphere of oxygen ($O_2$) gas and nitrogen ($N_2$) gas.

In example embodiments, the oxidation and nitridation processes on the sidewall of the light-shielding layer pattern may be performed by a light emitting process in an atmosphere of oxygen ($O_2$) gas and nitrogen ($N_2$) gas.

In example embodiments, the light emitting process may be performed using an ultraviolet (UV) light having a wavelength equal to or less than about 200 nm.

According to example embodiments, there is provided a photomask. The photomask includes a transparent substrate, a light-shielding layer pattern formed on the transparent substrate, a protection layer pattern formed on a lateral portion of the light-shielding layer pattern and an anti-reflective layer pattern formed on the light-shielding layer pattern and the protection layer pattern.

In example embodiments, the light-shielding layer pattern may include chromium (Cr) and the anti-reflective layer pattern may include chromium oxide (CrOx).

In example embodiments, the protection layer pattern may include either chromium oxynitride (CrNOx) or a mixture of chromium oxide (CrOx) and chromium nitride (CrNx).

According to example embodiments, a method of manufacturing a photomask is provided. The method includes forming a light-shielding layer composed of chromium (Cr) on a transparent substrate, forming an anti-reflective layer composed of chromium oxide (CrOx) on the light-shielding layer, partially etching the anti-reflective layer and the light-shielding layer to form a light-shielding layer pattern and an anti-reflective layer pattern sequentially stacked on the transparent substrate and performing an oxidation and a nitridation on a sidewall of the light-shielding layer pattern in a chamber maintained at a temperature of about 200° C. to about 400° C. to form a protection layer pattern composed of either chromium oxynitride (CrNox) or a mixture of chromium oxide (CrOx) and chromium nitride (CrNx) on a lateral portion of the light-shielding layer pattern. The protection layer pattern has a thickness of about 0.1 nm to about 50 nm.

According to example embodiments, a protection layer pattern including a metal oxide, a metal nitride and/or a metal oxynitride may be formed on a sidewall of a light-shielding layer pattern of a photomask. Thus, the light-shielding layer pattern may be protected from an acidic solution that is used for a recycling process of the photomask. Therefore, the photomask may be reused without a variation of a line width so that the reliability and economical efficiency of manufacturing semiconductor devices may be increased.

BRIEF DESCRIPTION OF THE DRAWINGS

Example embodiments will be more clearly understood from the following detailed description taken in conjunction with the accompanying drawings.

FIG. 1 is a cross-sectional view illustrating a photomask in accordance with an example embodiment;

FIG. 2 is a schematic view illustrating a line width change of a light-shielding pattern after a recycling process of a photomask; and FIGS. 3 to 5 are cross-sectional views illustrating a method of manufacturing a photomask in accordance with an example embodiment.

DETAILED DESCRIPTION OF EXEMPLARY EMBODIMENTS

Figure 1:
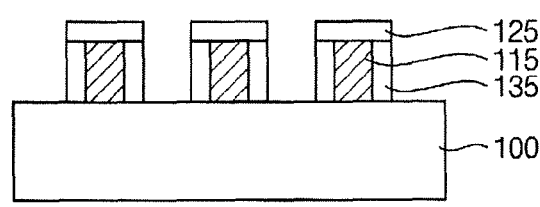
FIGS. 1 to 5 represent non-limiting, example embodiments as described herein.

Various example embodiments will be described more fully hereinafter with reference to the accompanying drawings, in which some example embodiments are shown. Example embodiments of the present inventive concept may, however, be embodied in many different forms and should not be construed as limited to example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. Like numerals refer to like elements throughout. As used herein, the term "and/or" includes any and all combinations of one or more of the associated listed items.

Hereinafter, example embodiments will be explained in detail with reference to the accompanying drawings.

FIG. 1 is a cross-sectional view illustrating a photomask in accordance with an example embodiment.

Referring to FIG. 1, the photomask may include, for example, a light-shielding layer pattern 115, a protection layer pattern 135 and an anti-reflective layer pattern 125 on a transparent substrate 100.

The transparent substrate 100 may include a material that is transmissive to an exposure light such as, for example, quartz or glass.

The light-shielding layer pattern 115 may include a material that is substantially not transmissive to the exposure light. In some example embodiments, the light-shielding layer pattern 115 may include, for example, a metal, e.g., chromium (Cr).

The protection layer pattern 135 may be formed on a sidewall of the light-shielding layer pattern 115. The protection layer pattern 135 may prevent a line width of the light-shielding layer pattern 115 from being changed or varying in a recycling process of the photomask.

In the recycling process of the photomask, a pellicle for protecting the photomask may be removed, and then a pellicle may be re-attached to the photomask in a repellicle process. To remove the pellicle from the photomask, an adhesive used for attaching the pellicle may be removed. For this purpose, a stripping solution including, for example, an acidic solution, e.g., sulfuric acid may be used.

Figure 2:
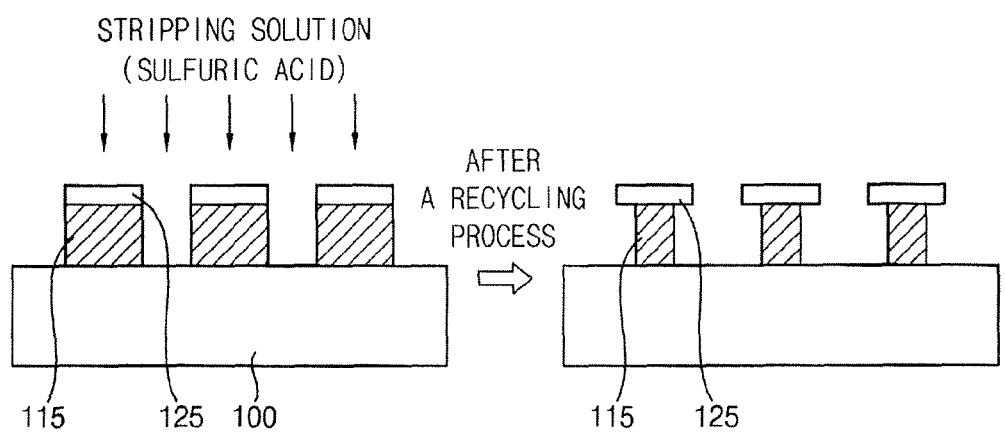

FIG. 2 is a schematic view illustrating a line width change of a light-shielding pattern after a recycling process of a photomask.

As illustrated in FIG. 2, when the light-shielding layer pattern 115 including a metal such as, for example, chromium is exposed to a stripping solution, the sidewall of the light-shielding layer pattern 115 may be etched so that a line width of the light-shielding layer pattern 115 may be reduced. Accordingly, a distribution or a deviation of a line width of an entire photomask may be increased.

For example, when the integration degree of a semiconductor device is increased, a small variation in the line width of the photomask may severely deteriorate the reliability or quality of the semiconductor device.

Therefore, the protection layer pattern 135 may include a chemically robust or stable material that may not be etched by the stripping solution to protect the light-shielding layer pattern 115. In example embodiments, the protection layer pattern 135 may include, for example, either chromium oxynitride (CrNOx) or a mixture of chromium oxide (CrOx) and chromium nitride (CrNx).

The anti-reflective layer pattern 125 may be formed on top surfaces of the light-shielding layer pattern 115 and the protection layer pattern 135. The anti-reflective layer pattern 125 may absorb a reflected light from a wafer in an exposure process. The anti-reflective layer pattern 125 may include, for example, a metal nitride or a metal oxide. For example, in some example embodiments, the anti-reflective layer pattern 125 may include chromium oxide or chromium nitride when the light-shielding layer pattern 115 includes chromium.

Figure 3:
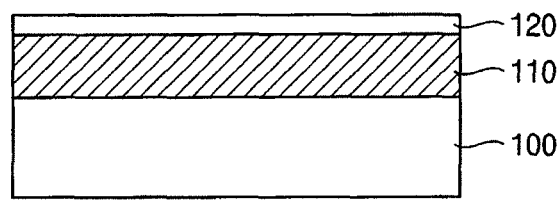
Figure 4:
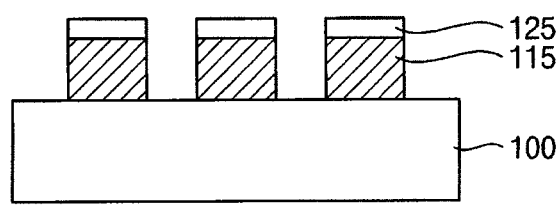
Figure 5:
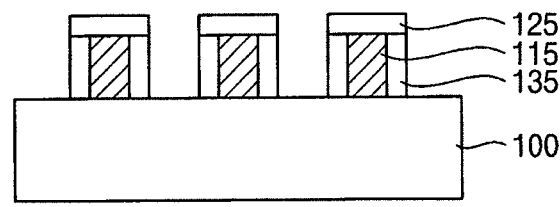

FIGS. 3 to 5 are cross-sectional views illustrating a method of manufacturing a photomask in accordance with an example embodiment.

Referring to FIG. 3, a light-shielding layer 110 and an anti-reflective layer 120 may be sequentially formed on a transparent substrate 100.

The transparent substrate 100 may include, e.g., quartz or glass as mentioned above.

The light-shielding layer 110 may be formed using a material that may block a light penetrating the transparent substrate 100 by, for example, a physical vapor deposition (PVD) process, a sputtering process, etc. In example embodiments, the light-shielding layer 110 may include, for example, a metal, e.g., chromium (Cr), aluminum (Al), rubidium (Rb), tantalum (Ta), etc. The light-shielding layer 110 may also include, for example, tantalum boron oxide (TaBO), tantalum boron nitride (TaBN), and the like.

The anti-reflective layer 120 may be formed on the light-shielding layer 110 using a material having a higher transmittance than that of the light-shielding layer 110 by, for example, a PVD process, a chemical vapor deposition (CVD) process, an atomic layer deposition (ALD) process, etc. For example, in some example embodiments, the anti-reflective layer 120 may be formed using chromium oxide or chromium nitride when the light-shielding layer 110 includes chromium. In other example embodiments, the anti-reflective layer 120 may be formed using, for example, titanium nitride (TiNx) or titanium oxide (TiOx).

Referring to FIG. 4, the anti-reflective layer 120 and the light-shielding layer 110 may be patterned to form a light-shielding layer pattern 115 and an anti-reflective layer pattern 125 sequentially stacked on the transparent substrate 100.

For example, a photoresist pattern (not illustrated) may be formed on the anti-reflective layer 120, and the anti-reflective layer 120 and the light-shielding layer 110 may be partially etched using the photoresist pattern as an etching mask. The anti-reflective layer 120 and the light-shielding layer 110 may be patterned by, for example, a dry etching process or a wet etching process. The photoresist pattern may be removed by, for example, an ashing and/or a stripping process.

Referring to FIG. 5, a protection layer pattern 135 may be formed on a lateral portion of the light-shielding layer pattern 115.

In example embodiments, the protection layer pattern 135 may be formed by, for example, by performing an oxidation and a nitridation on the sidewall of the light-shielding layer pattern 115. That is, the lateral portion of the light-shielding layer pattern 115 may be transformed into the protection layer pattern 135.

For example, in some example embodiments, the protection layer pattern 135 may be formed by performing a plasma treatment on the light-shielding layer pattern 115 using oxygen ($O_2$) gas and nitrogen ($N_2$) gas in a reactive gas. In the plasma treatment, a radical reaction may occur between the light-shielding layer pattern 115 and the reactive gas so that the lateral portion of the light-shielding layer pattern 115 may be transformed into the protection layer patterns 135 including an oxynitride. In some example embodiments, the protection layer patterns 135 may include, for example, either chromium oxynitride (CrNOx) or a mixture of chromium oxide (CrOx) and chromium nitride (CrNx).

The protection layer pattern 135 may be formed to have a thin thickness so as to prevent the damage or loss of the light-shielding pattern 115 in the recycling process as mentioned above. In some example embodiments, the protection layer pattern 135 may have a thickness of, for example, about 0.1 nm to about 50 nm, and preferably equal to or less than about 5 nm.

In some example embodiments, the plasma treatment may be performed in a chamber having a temperature of, for example, about 200° C. to about 400° C.

The oxygen gas and the nitrogen gas may be mixed to have a ratio of, for example, about 1:5 to about 1:8 so that the sufficient nitridation may be performed on the light-shielding layer pattern 115.

In some example embodiments, the protection layer pattern 135 may be formed by, for example, performing a rapid thermal process (RTP) on the light-shielding layer pattern 115.

In the RTP, a chamber may be maintained within a temperature of for example, about 200° C. to about 400° C. Oxygen gas and nitrogen gas may be introduced into the chamber, and then the chamber may be heated so that oxidation and nitridation or oxynitridation may occur at the lateral portion of the light-shielding layer pattern 115. The mixing ratio of the oxygen gas and the nitrogen gas may be, for example, about 1:5 to about 1:8, which is substantially the same as or similar to that in the plasma treatment.

In some example embodiments, the protection layer pattern 135 may be formed by, for example, performing a light emitting process on the light-shielding layer pattern 115. The light emitting process may be performed in, for example, an atmosphere of oxygen gas and nitrogen gas.

The light emitting process may be performed using, for example, an ultra-violet (UV) lamp that has a wavelength less than about 200 nm. An intensity of the UV lamp may be, for example, equal to or greater than about 30 mW/cm$^2$. For example, when the light-shielding layer pattern 115 includes chromium, chromium atoms included in the lateral portion of the light-shielding layer pattern 115 may be activated by the energy of UV light. The activated chromium atoms may be reacted with the oxygen gas and the nitrogen gas to form chromium oxynitride or a mixture of chromium oxide and chromium nitride.

Analysis on Components of a Protection Layer Pattern

A light-shielding layer pattern including chromium was prepared and a protection layer pattern was formed on a surface of the light-shielding layer pattern. Components of the protection layer pattern were detected by a Time-of-flight secondary ion mass spectrometer (TOF-SIMS) analysis.

A photomask of Comparative Example 1 was prepared by forming a light-shielding layer pattern including chromium on a transparent substrate. The TOF-SIMS analysis was conducted on the photomask of Comparative Example 1, and the peak intensity of chromium oxide and chromium nitride was measured.

A photomask of Example 1 was prepared by forming a light-shielding layer pattern including chromium on a transparent substrate and a protection layer pattern on a surface of the light-shielding layer pattern. The protection layer pattern was formed by performing a plasma treatment on the light-shielding layer pattern using oxygen gas and nitrogen gas as a reactive gas. A chamber was maintained at a temperature of about 300° C. Flow rates of the oxygen gas and the nitrogen gas were controlled at 500 sccm and 3,000 sccm, respectively.

The TOF-SIMS analysis was also conducted on the photomask of Example 1, and the peak intensity of chromium oxide and chromium nitride was measured.

A peak of chromium nitride in Example 1 was measured to have an intensity of about 1.5 times greater than that in Comparative Example 1. A peak of chromium oxide in Example 1 was measured to have an intensity of about two times greater than that in Comparative Example 1.

As seen in Example 1, chromium oxide and chromium nitride were mixed to form the protection layer pattern. Additionally, the peak of chromium oxide was relatively strong with respect to the peak of chromium nitride even though the flow rate of the oxygen gas was controlled to be lower than that of the nitrogen gas. Thus, to generate a sufficient nitridation, the flow rate of the nitrogen gas may be controlled to be about 5 times greater than that of the oxygen gas.

Evaluation on a Resistance of a Protection Layer Pattern to an Acidic Solution

A protection layer pattern was formed on a lateral portion of a light-shielding layer pattern including chromium according to example embodiments. The protection layer pattern was exposed to an acidic solution, and an amount of the protection layer pattern etched by the acidic solution was estimated.

By performing the process as illustrated above, a photomask of Example 2 including a protection layer pattern on a lateral portion of a light-shielding layer pattern was prepared.

Specifically, the light-shielding layer pattern including chromium was formed on a transparent substrate, and an anti-reflective layer pattern including chromium oxide was formed on the light-shielding layer pattern. The protection layer pattern was formed on the lateral portion of the light-shielding layer pattern by performing a plasma treatment on the light-shielding layer pattern using oxygen gas and nitrogen gas in a reactive gas. A chamber was maintained at a temperature of about 300° C. Flow rates of the oxygen gas and the nitrogen gas were controlled at 500 sccm and 3,000 sccm, respectively.

A photomask of Comparative Example 2 not having a protection layer pattern on a light-shielding layer pattern was prepared.

The photomasks of Example 2 and Comparative Example 2 were immersed in a sulfuric acid solution at a temperature of about 90° C. for about 300 minutes, and line width changes of the protection layer pattern and the light-shielding layer pattern were measured (Experiment 1). The photomasks were immersed in a sulfuric acid solution at a temperature of about 90° C. for about 300 minutes, and line width changes were measured (Experiment 2).

TABLE 1

|  | Example 2 | Comparative Example 2 |
| --- | --- | --- |
| Experiment 1 | 0.04 nm | 10 nm |
| Experiment 2 | 0.04 nm | 6 nm |

As shown in Table 1, in Comparative Example 2, a sidewall of the light-shielding layer pattern of the photomask was etched or damaged greatly by the sulfuric acid solution. In contrast, line width changes of the protection layer pattern of Example 2 were maintained extremely small in both of Experiments 1 and 2. That is, the protection layer pattern of Example 2 showed a great resistance to the sulfuric acid solution.

Therefore, a photomask including a protection layer pattern according to example embodiments may have a uniform line width even after repeated recycling processes.

Having described example embodiments of the present inventive concept, it is further noted that it is readily apparent to those of reasonable skill in the art that various modifications may be made without departing from the spirit and scope of the invention which is defined by the metes and bounds of the appended claims.

What is claimed is:

1. A method of manufacturing a photomask, comprising:
    forming a light-shielding layer pattern and an anti-reflective layer pattern sequentially on a transparent substrate; and
    performing an oxidation and a nitridation on a sidewall of the light-shielding layer pattern to form a protection layer pattern on a lateral portion of the light-shielding layer pattern using oxygen ($O_2$) gas and nitrogen ($N_2$) gas, wherein a mixing ratio of the oxygen gas and the nitrogen gas is within about 1:5 to about 1:8.

2. The method of claim 1, wherein the oxidation and the nitridation on the sidewall of the light-shielding layer pattern are performed by a plasma treatment using the oxygen ($O_2$) gas and the nitrogen ($N_2$) gas in a reactive gas.

3. The method of claim 2, wherein the plasma treatment is performed in a chamber maintained at a temperature of about 200° C. to about 400° C.

4. The method of claim 1, wherein the light-shielding layer pattern includes at least one selected from chromium (Cr), aluminum (Al), rubidium (Rb), tantalum (Ta), tantalum boron oxide (TaBO) and tantalum boron nitride (TaBN).

5. The method of claim 4, wherein the light-shielding layer pattern includes chromium.

6. The method of claim 5, wherein the protection layer pattern includes either chromium oxynitride (CrNOx) or a mixture of chromium oxide (CrOx) and chromium nitride (CrNx).

7. The method of claim 1, wherein the anti-reflective layer pattern includes at least one of chromium oxide (CrOx), chromium nitride (CrNx), titanium nitride (TiN) and titanium oxide (TiOx).

8. The method of claim 1, wherein the protection layer pattern is not etched by an acidic solution.

9. The method of claim 1, wherein the oxidation and the nitridation on the sidewall of the light-shielding layer pattern are performed by a rapid thermal process (RTP) in an atmosphere of oxygen ($O_2$) gas and nitrogen ($N_2$) gas.

10. The method of claim 1, wherein the oxidation and the nitridation on the sidewall of the light-shielding layer pattern are performed by a light emitting process in an atmosphere of oxygen ($O_2$) gas and nitrogen ($N_2$) gas.

11. The method of claim 10, wherein the light emitting process is performed using an ultraviolet (UV) light having a wavelength no greater than about 200 nm.

12. A method of manufacturing a photomask, comprising:
    forming a light-shielding layer composed of chromium (Cr) on a transparent substrate;
    forming an anti-reflective layer composed of chromium oxide (CrOx) on the light-shielding layer;
    partially etching the anti-reflective layer and the light-shielding layer to form a light-shielding layer pattern and an anti-reflective layer pattern sequentially stacked on the transparent substrate; and
    performing an oxidation and a nitridation on a sidewall of the light-shielding layer pattern using oxygen ($O_2$) gas and nitrogen ($N_2$) gas in a chamber maintained at a temperature of about 200° C. to about 400° C. to form a protection layer pattern composed of either chromium oxynitride (CrNOx), or a mixture of chromium oxide (CrOx) and chromium nitride (CrNx) on a lateral portion of the light-shielding layer pattern, and wherein the protection layer pattern has a thickness of about 0.1 nm to about 50 nm, and wherein a mixing ratio of the oxygen ($O_2$) gas and the nitrogen ($N_2$) gas is within about 1:5 to about 1:8.

13. The method of claim 12, wherein the thickness of the protection layer pattern is no greater than about 5 nm.

14. The method of claim 12, wherein the oxidation and the nitridation on the sidewall of the light-shielding layer pattern are performed by a plasma treatment using the oxygen ($O_2$) gas and the nitrogen ($N_2$) gas in a reactive gas, and wherein a first flow rate of the nitrogen ($N_2$) gas is controlled to be about 5 times greater than a second flow rate of the oxygen ($O_2$) gas.

* * * * *